United States Patent
Mangahas et al.

(10) Patent No.: US 6,313,769 B1
(45) Date of Patent: Nov. 6, 2001

(54) BASEBAND DIGITAL OFFSET CORRECTION

(75) Inventors: Mandell J. Mangahas, Allentown; Ramin Khoini-Poorfard, Coopersburg, both of PA (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/563,874

(22) Filed: May 3, 2000

(51) Int. Cl.[7] .................................................. H03M 1/06
(52) U.S. Cl. ........................................ 341/118; 341/120
(58) Field of Search .................................. 341/118, 120, 341/139, 144

(56) References Cited

U.S. PATENT DOCUMENTS 4,196,420 * 4/1980 Culmer et al. ....................... 341/156
5,381,148 * 1/1995 Mueck et al. ........................ 341/139

OTHER PUBLICATIONS

Paschal Minogue, "A 3V GSM Codec", *IEEE Journal of Solid State Circuits*, vol. 30, No. 12, pp. 1411–1417 (Dec. 1995).

Frank Goodenough "12–Bit IC ADC's Guarantee ±1 LSB from −55° to +125° C." *Electronic Design*, 4 pages, (Sep. 3, 1992).

* cited by examiner

*Primary Examiner*—Peguy JeanPierre
*Assistant Examiner*—Joseph Lauture
(74) *Attorney, Agent, or Firm*—Ratner & Prestia

(57) ABSTRACT

A signal processing system includes a main digital-to-analog converter (DAC) for receiving a digital baseband signal and converting the digital signal into an analog signal. Also included in the system is a connection circuit for receiving the analog signal, and output terminal, and an analog filter coupled between the connection circuit and the output terminal for filtering the analog signal. The system includes a calibration circuit coupled between the connection circuit and the output terminal for setting an offset voltage level. The calibration circuit includes (a) an approximation circuit coupled to the output terminal and operable during a calibration mode to determine the offset voltage level and store the offset voltage level as a digital offset signal and (b) an offset DAC coupled between the connection circuit and the approximation circuit for converting the digital offset signal into the offset voltage level. The connection circuit, which is a node, subtracts the offset voltage level from the analog signal.

12 Claims, 4 Drawing Sheets

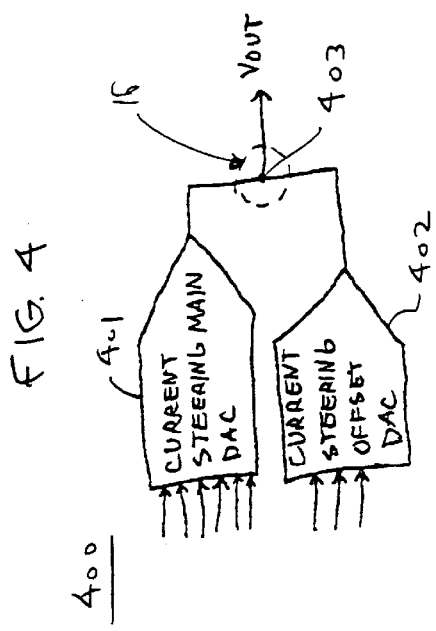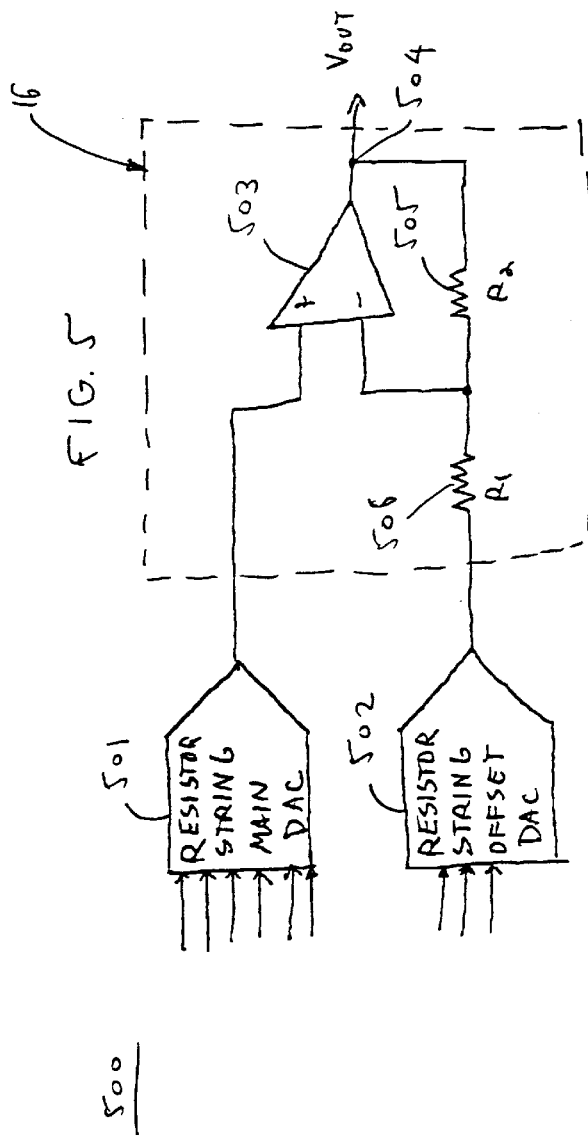

BASEBAND DIGITAL OFFSET CORRECTION

TECHNICAL FIELD

The present invention relates, in general, to wireless mobile communications and, more particularly, to calibrating a digital-to-analog converter (DAC) in a mobile telephone.

BACKGROUND OF THE INVENTION

In wireless mobile communications, a codec device is typically used to perform analog-to-digital conversion or digital-to-analog conversion of a baseband signal. Before transmitting the baseband signal, the signal must be amplified. Any DC-offset voltage present in the baseband signal is also amplified, causing signal distortion and saturation. As a result, the DC-offset voltage must be eliminated by determining its level and subtracting that level from the baseband signal.

Early generation cellular phones transmit short bursts of signals. DC-offset compensation is achievable by storing the DC-offset voltage across a capacitor. Since transmission is in short bursts, the DC-offset value is calculated and stored across the capacitor before each burst of data. Problems of capacitor leakage influencing the stored DC-offset may largely be ignored.

Next generation cellular phones, on the other hand, using standards, such as GSM Phase II+ and WCDMA, require the mobile phone to transmit in multiple time slots or in continuous mode. As such, the baseband signal must be transmitted free of any DC-offset for extended periods of time. Continuous operation precludes storing the DC-offset across a capacitor. The DC-offset stored across the capacitor leaks away during the extended period of operation.

It is desirable, therefore, to solve the problem associated with baseband signal offset correction. This invention addresses that problem.

SUMMARY OF THE INVENTION

To meet this and other needs, and in view of its purposes, the present invention provides a signal processing system including a main digital-to-analog converter (DAC) for receiving a digital baseband signal and converting the digital signal into an analog signal. Also included in the system is a connection circuit for receiving the analog signal, an output terminal, and an analog filter coupled between the connection circuit and the output terminal for filtering the analog signal. The system includes a calibration circuit coupled between the connection circuit and the output terminal for setting an offset voltage level. The calibration circuit includes (a) an approximation circuit coupled to the output terminal and operable during a calibration mode to determine the offset voltage level and store the offset voltage level as a digital offset signal, and (b) an offset DAC coupled between the connection circuit and the approximation circuit for converting the digital offset signal into the offset voltage level. The connection circuit, which is a node, subtracts the offset voltage level from the analog signal.

In one embodiment, the main DAC receives the digital baseband signal as n-parallel bits and the offset DAC receives the digital offset signal as less than or equal to n/2 parallel bits. The approximation circuit includes a comparator connected to the output terminal for receiving the filtered analog signal and providing an intermediate offset voltage level during the calibration mode. The approximation circuit (a) receives the intermediate offset voltage level, (b) converts the intermediate offset voltage level into digital bits including a most significant bit (MSB) value and a least significant bit (LSB) value, and (c) subtracts a ½ LSB value from the intermediate offset voltage level to form the digital offset signal.

It is to be understood that both the foregoing general description a the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures:

FIG. 4 is a block diagram of a current steering architecture according to a preferred embodiment of the invention; and FIG. 5 is a block diagram of a resistor string architecture according to another embodiment of the invention.

DETAILED DESCRIPTION OF THE INVENTION

Figure 1:
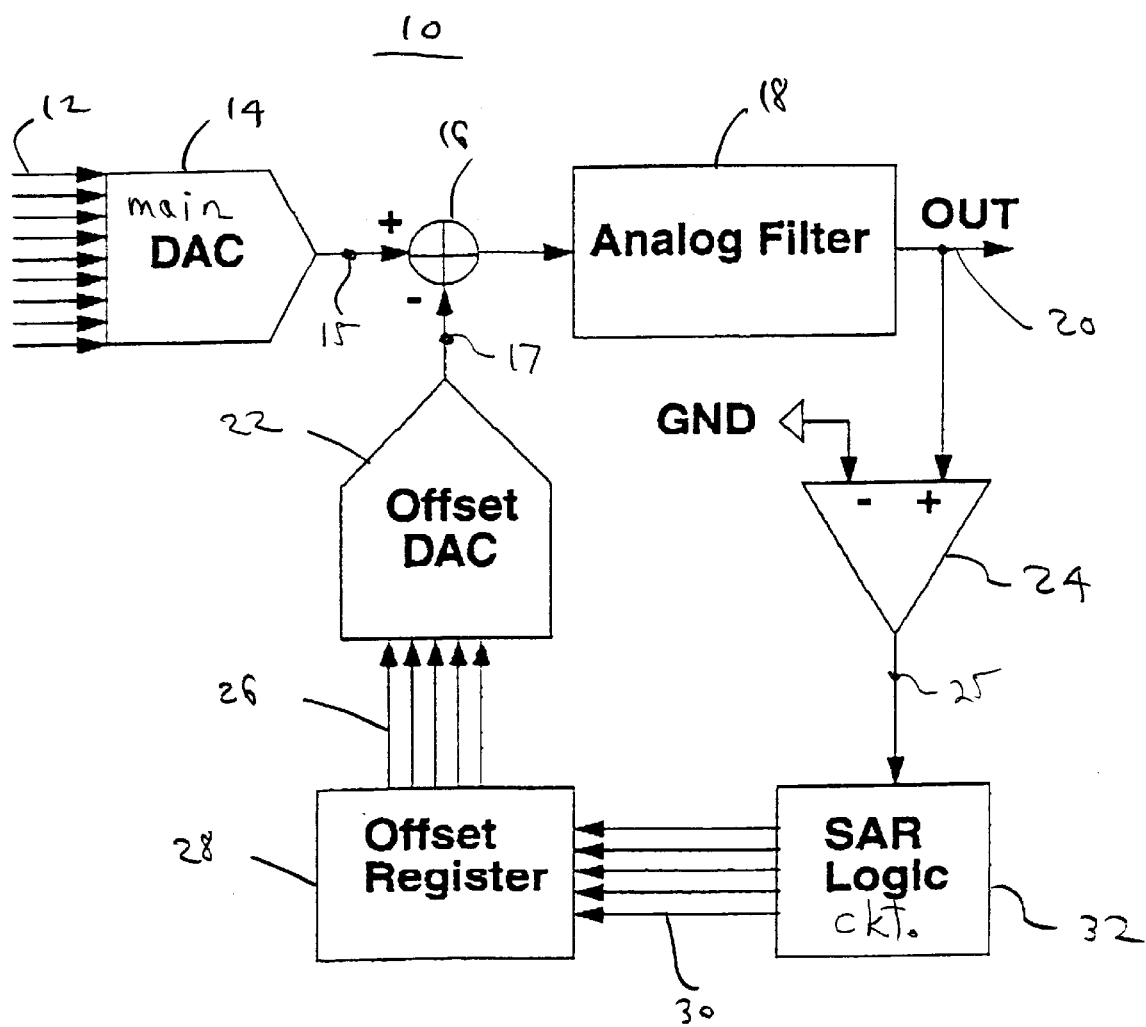
FIG. 1 is a block diagram of a signal processing system according to one embodiment of the invention.

With reference to FIG. 1 there is shown a block diagram of a calibrated digital-to-analog converter (DAC) in a signal processing system, generally designated as 10. As shown, main DAC 14 receives a digital baseband signal on bus 12. The digital baseband signal is converted into an analog signal at DAC output terminal 15. As will be explained, the analog signal passes through connection circuit 16, is filtered by analog filter 18 and is output from output terminal 20.

Although not shown, it will be appreciated that main DAC 14, connection circuit 16 and analog filter 18 are part of a processing path in a wireless is mobile telephone using, for example, GSM Phase II+ or WCDMA standards. Filtered output terminal 20 may be connected, for example, to an RF modulator and transmitter which require transmission of the baseband signal free of any DC-offset voltage level.

The digital input signal is received on bus 12. Depending on the resolution requirement of signal processing system 10, bus 12 may include n-parallel lines providing a resolution of n-bits, whereby n may be as small as 4 and as large as 16, for example. As is well understood, one binary bit position provides the most significant bit (MSB) and another binary bit position provides the least significant bit (LSB).

Having described the main processing path of signal processing system 10, the calibration path will now be described. The calibration path includes sequentially as shown in FIG. 1, comparator 24, successive approximation register (SAR) logic circuit 32, offset register 28 and offset DAC 22. Comparator 24 receives the filtered analog signal from output terminal 20, compares the filtered analog signal to a ground reference level of zero volts and provides an output voltage at terminal 25. The output voltage at terminal 25 is hereinafter referred to as an intermediate offset voltage level.

SAR logic circuit 32 receives the intermediate offset voltage level and using a binary search algorithm (discussed below) provides a digital offset signal. Offset register 28 stores the digital offset signal and provides it to offset DAC 22. Operating similarly to main DAC 14, offset DAC 22 converts the digital offset signal into an offset voltage reference level at output terminal 17. The offset voltage reference level at terminal 17 is subtracted from the analog signal at terminal 15 by connection circuit 16. Since offset register 28 stores the digital offset signal as a digital word, the conversion of the digital word into an analog offset voltage by offset DAC 22 is correctly maintained. As a result, the problem of conventional methods for storing an offset voltage across a capacitor is not present. The digital word stored in offset register 28 is changed by SAR logic circuit 32 by way of bus 30.

In the preferred embodiment of the invention, offset DAC 22 is constructed similar to main DAC 12. The size of offset DAC 22 is different, however, from main DAC 14. Whereas main DAC 14 accepts a digital word of n-bits for conversion, offset DAC 22 accepts a digital word of less than or equal to n/2 bits. Offset DAC 22 is constructed as an exact copy of the lower n/2 bits of main DAC 14.

Figure 3:
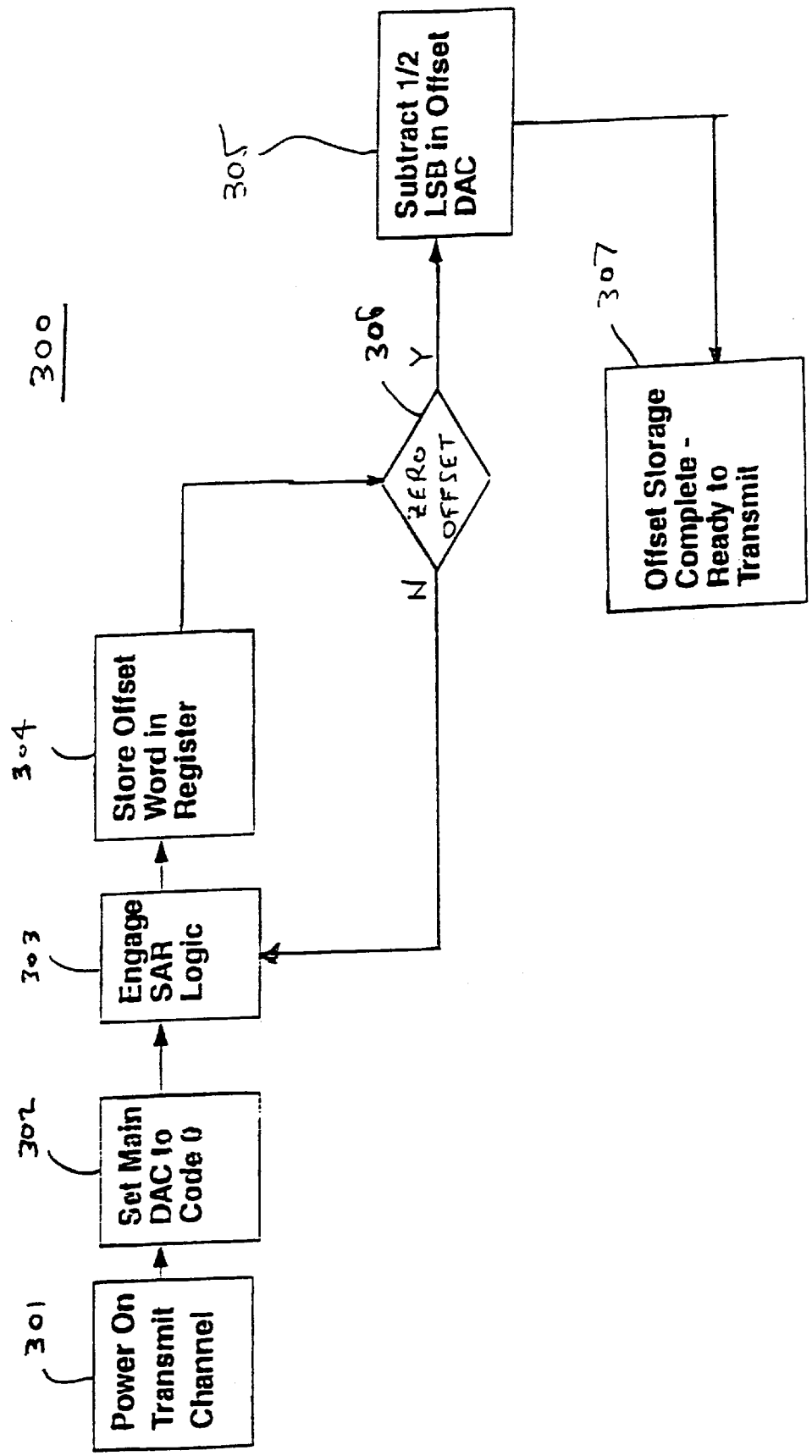
FIG. 3 is a flow diagram showing calibration steps performed by the system of FIG. 1.

Operation of the calibration circuit in signal processing system 10 will now be described with reference to FIG. 3. Signal processing system 10, for example, may have two modes of operation, a normal mode and a calibration mode. In the normal mode, main DAC 14 may process a digital word placed on bus 12 by a microprocessor (not shown). The digital word is filtered by analog filter 18, modulated and transmitted. The SAR logic circuit is not operational during the normal mode.

The calibration mode is described next. Prior to transmission of the baseband signal, the offset voltage level is determined so that the main DAC may be calibrated by subtracting the offset voltage level from the baseband signal. This operation is performed by calibration procedure 300, as shown in FIG. 3. The procedure is initiated by step 301, which recognizes that the transmit channel of the mobile phone is powered-on and is being readied for signal transmission. The system is placed in the calibration mode by the microprocessor. A digital word with a code value of zero (ground reference level) is placed on bus 12, as an input signal to main DAC 14. This code-zero word is provided by the microprocessor during step 302.

The SAR logic circuit is engaged in step 303, having been inactive beforehand. The analog value of the code-zero word, after being filtered, is passed through comparator 24 and recognized by the SAR logic circuit as the intermediate offset voltage level. This voltage level is converted into an intermediate digital offset word and stored in offset register 28 during step 304.

Step 306 checks whether the intermediate offset value has been determined. If the intermediate offset value has not been determined, the procedure branches to step 303. If the intermediate offset value has been determined, the procedure branches to step 305. In the preferred embodiment of the invention, step 305 subtracts ½ of an LSB value from the intermediate digital offset word stored in offset register 28. Due to the asymmetry in a digital word and the algorithms used in successive approximation, the offset word is expected to have an average error of ½ LSB±½ LSB. The invention recognizes this and subtracts a ½ LSB, after the SAR logic algorithms have been executed. This subtraction results in an average offset error of 0 LSB±½ LSB. Since the offset storage is now complete, step 307 is entered and the system is ready to transmit without any DC offset.

It will be understood that the internal offset value provided by comparator 24 is cancelled before the calibration procedure begins. This may be done by a capacitance based method since the comparator only needs to be operational for a relatively short period. After the offset cancellation of the channel is completed, the comparator may be turned off, thereby further reducing power consumption.

In the preferred embodiment, offset register 28 is a universally read/write register. Instead of calibrating the offset at the beginning of every transmit burst, the calibration procedure is only performed once, because the offset register continuously stores the digital word. This saves power, time and overhead because the DC offset does not need to be cancelled before every burst.

Figure 2:
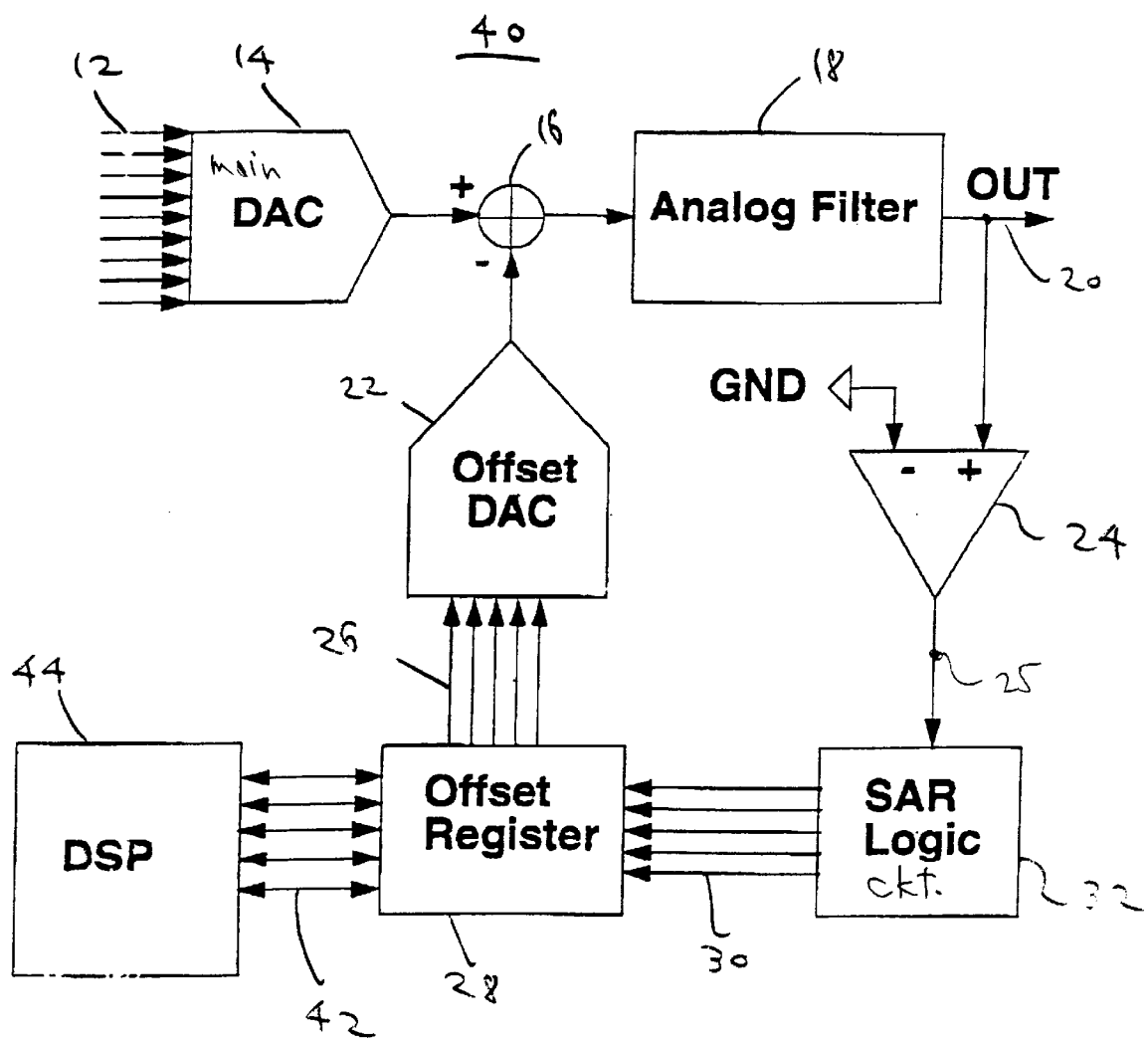
FIG. 2 is a block diagram of a signal processing system according to another embodiment of the invention.

The offset register may also be coupled to a microprocessor, for example digital signal processor (DSP) 44 by way of bus 42, as shown in signal processing system 40 of FIG. 2. Although shown as a separate bus, DSP 44 may communicate with offset register 28 on bus 30, which is also used by SAR logic circuit 32. A separate bus is not necessary.

DSP 44 provides additional flexibility in signal processing system 40. For example, the DSP may compensate for the temperature coefficients of main DAC 14. If the temperature coefficients of the main DAC are stored in the DSP, the DSP may modify the word stored in offset register 28 to compensate for temperature variations in the offset signal. In addition, the offset voltage level may be adjusted when the gain of offset DAC 22 or analog filter 18 is changed. If either one of these gains is adjustable during operation of the channel, an offset calibration may be performed for each gain setting and stored in a look-up table. In this manner, the DSP may use the look-up table to adjust the DC offset according to the gain set for the offset DAC or the analog filter.

As discussed before, the main DAC and offset DAC are identical to each other, except for the number of input bits. Whereas the main DAC includes n-bits at the input side, the offset DAC needs to only include n/2 bits or less. The offset DAC is an exact copy of the lower significant n/2 bits of the main DAC. Because the architecture of the main DAC is identical to the architecture of the offset DAC, the two DACs may be placed in parallel with each other. This may be seen by referring to FIGS. 4 and 5. FIG. 4 depicts a current steering architecture 400, and FIG. 5 depicts a resistor string architecture 500.

In the preferred embodiment of the invention, as shown in FIG. 4, current steering main DAC 401 and current steering offset DAC 402 are connected in parallel at node 403. Thus, connection circuit 16, shown in FIGS. 1 and 4, is simply a node. The output terminals of the two DACs are connected together at node 403. This provides an effective and simple architecture, in which the respective voltage output signals of the DACs may be subtracted from each other.

The other architecture is shown in FIG. 5. As shown, resistor string main DAC 501 and resistor string offset DAC 502 are connected in parallel by way of connection circuit 16. This connection circuit includes operational amplifier 503 having a positive input terminal and a negative input terminal, each respectively coupled to the output sides of main DAC 501 and offset DAC 502. In order to adjust for gain differences between the two DACs, resistors 505 and 506 are shown coupled between offset DAC 502 and output terminal 504.

In the preferred embodiment of the current steering DACs shown in FIG. 4, the offset DAC is an exact copy of the lower LSBs of the main DAC and the two DACs may easily be connected at a node to perform the necessary analog subtraction of the offset voltage from the baseband signal. Thus, the subtraction circuit is reliable and saves power consumption and fabrication real estate in the mobile phone. In addition, by subtracting the offset in the analog domain when placing the two DACs in parallel with each other, the dynamic range of the processing channel is preserved.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A signal processing system comprising:
   a main digital-to-analog converter (DAC) for receiving a digital baseband signal and converting the digital signal into an analog signal;
   a connection circuit for receiving the analog signal from the main DAC;
   an output terminal;
   an analog filter coupled between the connection circuit and the output terminal for filtering the analog signal; and
   a calibration circuit coupled in a feedback path between the connection circuit and the output terminal for setting an offset voltage level, the calibration circuit including:
   (a) an approximation circuit coupled to the output terminal and operable during a calibration mode to determine the offset voltage level and store the offset voltage level as a digital offset signal, and
   (b) an offset DAC coupled between the connection circuit and the approximation circuit for converting the digital offset signal into the offset voltage level;
   wherein the connection circuit subtracts the offset voltage level provided by the offset DAC from the analog signal provided by the main DAC.

2. The signal processing system of claim 1 wherein the connection circuit is a node.

3. The signal processing system of claim 1 wherein the connection circuit is an operational amplifier including one input terminal for receiving the analog signal and a second input terminal for receiving the offset voltage level.

4. The signal processing system of claim 1 wherein the main DAC receives the digital baseband signal as n-parallel bits and the offset DAC receives the digital offset signal as less than or equal to n/2 parallel bits.

5. The signal processing system of claim 1 wherein the approximation circuit includes a comparator connected to the output terminal for receiving the filtered analog signal and operative for providing an intermediate offset voltage level during the calibration mode.

6. The signal processing system of claim 5 wherein the approximation circuit further includes a successive approximation register (SAR) circuit for
   (a) receiving the intermediate offset voltage level,
   (b) converting the intermediate offset voltage level into digital bits including a most significant bit (MSB) value and a least significant bit (LSB) value, and
   (c) subtracting a ½ LSB value from the intermediate offset voltage level to form the digital offset signal.

7. The signal processing system of claim 6 wherein the approximation circuit further includes an offset register coupled between the SAR circuit and the offset DAC for storing the digital offset signal.

8. The signal processing system of claim 7 wherein the approximation circuit further includes a DSP for providing a compensation voltage to the offset register, the compensation voltage varying as a function of one of temperature and gain.

9. In a signal processing system having a main DAC for converting a baseband digital input signal into an analog signal, a method for calibrating the main DAC comprising the steps of:
   (a) setting the baseband digital input signal to a zero voltage reference;
   (b) measuring the voltage level of the analog signal;
   (c) converting the voltage level of the analog signal into an offset word;
   (d) storing the offset word in a register;
   (e) converting the offset word in the register into an analog offset voltage by using an offset DAC; and
   (f) subtracting the analog offset voltage provided by the offset DAC from the analog signal provided by the main DAC.

10. The method of claim 9 wherein step (e) includes subtracting the analog offset voltage from the analog signal by connecting an output terminal of the main DAC and an output terminal of the offset DAC at a node.

11. The method of claim 9 wherein step (e) includes subtracting the analog offset voltage from the analog signal by connecting an output terminal of the main DAC and an output terminal of the offset DAC to an operational amplifier.

12. The method of claim 9 wherein step (c) includes
   (i) converting the voltage level of the analog signal into an intermediate offset word having a LSB value, and
   (ii) subtracting a ½ LSB value from the intermediate offset word before forming the offset word.

* * * * *